United States Patent [19]

Kammerer

[11] Patent Number: 4,652,819

[45] Date of Patent: Mar. 24, 1987

[54] PROXIMITY SWITCH WITH CONTINUOUSLY OPERABLE TEST CIRCUIT RESPONSIVE TO BIPOLAR DOUBLE PULSES

[75] Inventor: Heinz Kammerer, Ostfildern, Fed. Rep. of Germany

[73] Assignee: Gebhard Balluff, Neuhausen, Fed. Rep. of Germany

[21] Appl. No.: 718,015

[22] PCT Filed: Jul. 26, 1984

[86] PCT No.: PCT/EP84/00231

§ 371 Date: Mar. 27, 1985

§ 102(e) Date: Mar. 27, 1985

[87] PCT Pub. No.: WO85/00712

PCT Pub. Date: Feb. 14, 1985

[30] Foreign Application Priority Data

Jul. 28, 1983 [DE] Fed. Rep. of Germany ....... 3327188

[51] Int. Cl.[4] .................. H03K 17/945; H01H 35/00; G01B 7/14; G08B 29/00
[52] U.S. Cl. .................................... 324/207; 307/116; 324/202; 324/236; 331/65; 340/514
[58] Field of Search ............... 324/202, 207, 208, 236, 324/237, 327, 328; 307/116; 331/64, 65; 340/514, 941; 361/179

[56] References Cited

U.S. PATENT DOCUMENTS

| 3,514,627 | 5/1970 | Bridgeman | 307/116 |
| 4,433,309 | 2/1984 | Hermle et al. | 331/65 |
| 4,502,042 | 2/1985 | Wuhrl et al. | 307/116 X |
| 4,525,699 | 6/1985 | Buck et al. | 340/514 X |

FOREIGN PATENT DOCUMENTS

| 0035225 | 9/1981 | European Pat. Off. |
| 3007929 | 9/1981 | Fed. Rep. of Germany. |
| 3150212 | 2/1983 | Fed. Rep. of Germany. |
| 3205737 | 9/1983 | Fed. Rep. of Germany. |

Primary Examiner—Gerard R. Strecker
Attorney, Agent, or Firm—Leydig, Voit & Mayer

[57] ABSTRACT

The invention relates to a self-testing proximity switch, wherein the testing is carried out with the aid of bipolar double pulses which, independently of the switching state of the trigger stage, each time cause a short-timed triggering thereof. At the output of the trigger stage, the superimposed pulses can be evaluated by the test circuit in order to monitor proper functioning of the proximity switch.

20 Claims, 3 Drawing Figures

PROXIMITY SWITCH WITH CONTINUOUSLY OPERABLE TEST CIRCUIT RESPONSIVE TO BIPOLAR DOUBLE PULSES

BACKGROUND OF THE INVENTION

1. Field of the Invention

The invention relates to a self-testing proximity switch having an oscillator; a demodulator; a trigger stage; a clocked test pulse source feeding the oscillator with test pulses having positive and negative amplitudes sufficiently high to trigger the trigger stage from either one of its switching states to the other for the duration of a single pulse in order to simulate a damping reduction or damping of the oscillator; and a test circuit responding to the level changes in the output signal of the trigger stage occurring in response to the test pulses, and serving to thereby generate a test output signal.

2. Description of the Related Art

A self-testing proximity switch of the kind having a selectively damped oscillator has been described in European laid-open patent application No. 0 035 225. The proper functioning of this proximity switch is tested by determining whether the oscillator is damped by a test pulse or whether the oscillation amplitude of the oscillator is reduced to zero by the test pulse, to simulate the approach of an element to be detected toward the active surface of the proximity switch.

This type of functional test fails to detect faults which result in the output signal of the proximity switch indicating a damped state of the oscillator even though the oscillator is not actually damped by an element brought sufficiently close to the active surface of the proximity switch. This disadvantage is eliminated in the proximity switch disclosed in German laid-open patent application No. 3 007 929 and further described in Hermle et al. U.S. Pat. No. 4,433,309, wherein oscillator damping reduction is also used for test purposes. In these proximity switches, the internal operating parameters of the oscillator are influenced to cause a change in the oscillation of the oscillator which corresponds to a certain change in position of an element, for example, a trip cam, that influences the resonant circuit externally. In other words, an external damping or damping reduction is simulated by internally influencing the internal operating parameters. These kind of proximity switches use so-called breakaway oscillators, wherein the oscillation breaks away (i.e., terminates) in the event of external or internal damping.

SUMMARY OF THE INVENTION

In view of the above, the primary object of the invention is to enable functional testing of a proximity switch without substantially influencing the internal operating parameters of the oscillator, regardless of the oscillating state of the oscillator, i.e., both in the damped and damping reduced state of the oscillator.

Briefly, in accordance with the invention, a self-testing proximity switch as recited above in the field of the invention is provided wherein the oscillator operates in an analog manner such that the amplitude of oscillation is constantly variable in response to damping, and in which the test pulses of the test pulse source are fed in the form of bipolar double pulses to a terminal of the oscillator at which the supply voltage and/or the supply current to the oscillator are combined with the pulses. In other words, the supply current and/or voltage to the oscillator is moduated by the test pulses, which in turn modulates the amplitude of oscillation in an analog fashion.

The invention is based on the general thought that with the aid of test pulses in the form of bipolar double pulses at a supply voltage terminal of the oscillator (either with the positive single pulse or with the negative single pulse of the double pulse depending on the oscillation state of the oscillator and the corresponding switching state of the trigger stage), it is possible to bring about a significant change in the amplitude of the oscillation of the oscillator, thus effecting, in any case, a signal change at the output of the trigger stage. These signal changes at the output of the trigger stage are then evaluated with the aid of a test circuit which, consequently, only generates an output signal indicating proper functioning of the proximity switch if the test pulses actually cause signal changes at the output of the trigger stage. This operating principle has the essential advantage that the functioning of the proximity switch may be checked continuously and independently of whether the resonant circuit is damped at that particular instant or not. In this case, the amplitude changes occur very rapidly in response to the test pulses, with the result that shorter test pulses may be used than with breakaway oscillators where particularly the starting of oscillations again after damping requires a considerable amount of time.

It is, furthermore, possible to adapt the amplitude of the test pulses very precisely to the amplitude change in the oscillation of the oscillator in the critical range, so that a fault is detected and indicated as soon as the operating parameters of the circuits of the proximity switch deviate outside of a predetermined tolerance range.

It has also proven expedient for the test circuit of the proximity switch according to the invention to be in the form of an active amplifier circuit, since, in this case, also faults in the test circuit itself may be detected immediately. The so-called current source circuit has proven to be the preferred active amplifier circuit It has, furthermore, proven advantageous for the test circuit itself to be inductively coupled to the output of the trigger stage, which prevents, for example, in the case of a fault in the trigger circuit, a permanent signal from reaching the test circuit and simulating at its output proper functioning of the proximity switch.

In a corresponding manner, it has also proven expedient for the test pulse source to be inductively or capacitively connected to the input of the oscillator to also prevent there the transmission of permanent signals which may occur on account of a malfuction, such as, for example, a short-circuit or an interruption.

In accordance with the invention, the duration of the test pulses is preferably selected such as to be shorter than the response time of the switching devices controlled by the output signals of the proximity switch, so that no signal changes caused by the test pulses become effective at the signal output of the proximity switch. Preferably, the duration of the test pulses are shorter than 0.5 ms, which in the event that relays are used as switching devices, is short enough to prevent the relays from responding. If necessary, however, it is also possible to work with longer test pulses whose effectiveness at the output is suppressed by corresponding timing elements.

Preferably the test pulses have a pulse repetition frequency of approximately 200 Hz, since a corresponding pulse repetition at the output of the trigger stage may be detected by a test circuit of technically simple design, with a capacitor connected to its output.

It is particularly advantageous for the amplitude of the positive and the negative single pulses of the test pulses to be selected such that at each operating point of the trigger stage, the switching threshold which is further removed from this operating point is just still exceedable. This design enables early detection of gradual changes in the operating parameters of the oscillator and/or the trigger stage resulting in signals lying outside of a predetermined tolerance range. In this case, it is particularly expedient for the positive and the negative amplitude of the single pulses of the test pulses to exactly correspond to the amplitude change when the oscillator is damped by a trip cam associated with the proximity switch, since it is then possible to simultaneously check with the output signal of the test circuit whether the predetermined response spacing of the proximity switch is still maintained or not.

BRIEF DESCRIPTION OF THE DRAWING

Further details and advantages of the invention will now be explained in greater detail with reference to the drawings, in which.

While the invention has been described in connection with the preferred embodiment, it will be understood that there is no intention to limit the invention to the particular embodiment shown but it is intended, on the contrary, to cover the various alternative and equivalent forms of the invention included within the spirit and scope of the appended claims.

DETAILED DESCRIPTION OF THE PREFERRED EMBODIMENT

Figure 1:
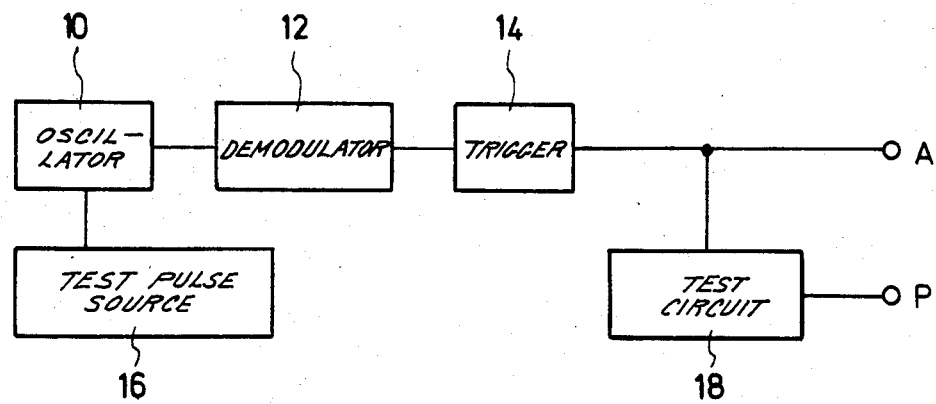
FIG. 1 shows a block circuit diagram with the essential components of a self-testing proximity switch according to the invention.

FIG. 1 shows in detail an oscillator 10, whose output is connected to a demodulator 12, at whose output a trigger stage 14 is connected. These three circuits 10, 12, 14 constitute the conventional circuits of a proximity switch and are normally supplemented by an amplifier at the output of the trigger stage 14 in order to obtain at the output A of the proximity switch a signal whose power is sufficient to, for example, directly actuate relays. In accordance with the invention, there is provided, in addition, a test pulse source 16 which is connected to the oscillator 10. Also provided is a test circuit 18 which is connected to the output of the trigger stage 14 and comprises as output a test output whose signal level indicates whether the proximity switch is operating properly or not.

In the proximity switch according to FIG. 1, the supply voltage and/or the supply current of the oscillator 10 is superimposed with test pulses originating from the test pulse source 16 which are in the form of bipolar double pulses such that of the two single pulses of each test pulse, the single pulse of the one polarity causes a decrease in the amplitude of the oscillation of the oscillator, while the other single pulse causes an increase in the amplitude of the oscillation of the oscillator. The output signal of the oscillator is demodulated or rectified in the demodulator 12 and fed to the input of the trigger stage 14, whose switching thresholds are selected such that as long as there is no test pulse at the oscillator, its output signal has a first level when the oscillator is damped and a second level when the oscillator damping is reduced. These signal levels are available—possibly after amplification—at the output A of the proximity switch to actuate in the conventional manner switching devices, in particular, relay switching devices connected downstream therefrom.

In accordance with the invention, the test pulses supplied by the test pulse source 16 enable variation of the output signal of the oscillator such that with each test pulse, the trigger stage changes its switching state independently of whichever of its two switching states it initially assumes on account of the actual damping or damping reduction. According to the invention, the changes caused by the test pulses in the switching state at the output of the trigger stage 14 are selected so short that the downstream switching devices do not respond to the short-timed level changes at the output of the trigger stage 14. These short-timed or pulse-shaped level changes at the output of the trigger stage are, however, detected by the test circuit 18 which, in the absence of a level change at the output of the trigger stage within a predetermined time interval, then delivers at its test output P a signal which indicates a malfunction in the proximity switch.

The functioning of the proximity switch according to the invention which has been described in general hereinabove, shall now be explained in greater detail with reference to the circuit diagram of FIG. 2. As is apparent from FIG. 2, the oscillator 10 according to a preferred exemplary embodiment of the invention is in the form of an oscillator operating in an analog manner which is connected to the two poles of a supply voltage source (not illustrated) which supplies a positive voltage $+U$ and a (relative thereto) negative voltage $-U$. In the exemplary embodiment relating to an inductive proximity switch, the oscillator 10 comprises in a known manner an inductor L, a first capacitor C1, two npn transistors T1, T2 and five resistors R1 to R5, with the resistor R5 being in the form of an adjustable resistor or a potentiometer. An oscillator 10 of the pertinent type is described in the company publication "Integrated Circuit Design Manual; Linear-Interdesign" of August 1980 of the company Ferranti.

Figure 3:
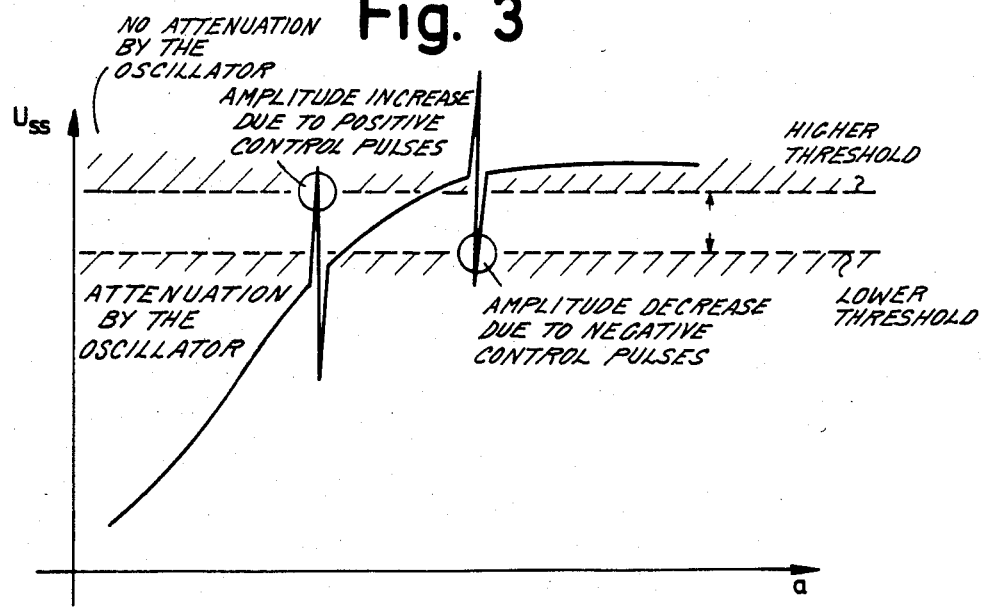
FIG. 3 shows a diagram to explain the mode of operation of a proximity switch according to the invention.
Figure 2:
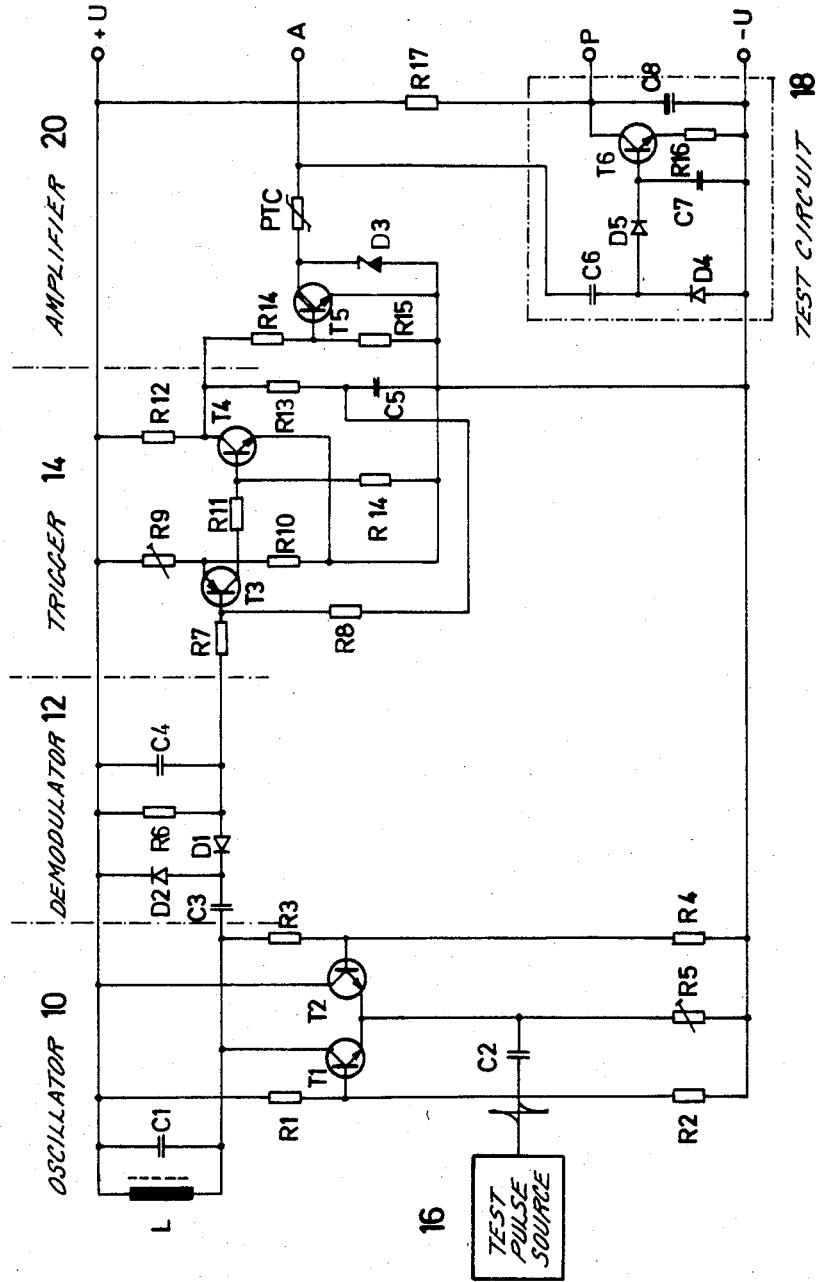
FIG. 2 shows a detailed circuit diagram of a self-testing proximity switch according to the invention.

In accordance with FIG. 2, the test pulse source 16 is coupled via a capacitor C2 to the common connection point of the emitters of the two transistors T1 and T2. The test pulse source 16 is so designed that as indicated in the drawing at the output of the test pulse source, it supplies steep and relatively short bipolar double pulses. The output signal of the oscillator 10 is directly superimposed with these double pulses, as is apparent from FIG. 3, where the oscillator voltage $U_{ss}$ is graphed as a function of the spacing a of a trip cam (not shown) from the active surface (e.g., L in FIG. 2) of the proximity switch. Specifically, $U_{ss}$ is the magnitude of the voltage difference across C4 in FIG. 2, and represents the amplitude of oscillation of the oscillator (10 in FIG. 1). As further illustrated in FIG. 3, the higher threshold and the lower threshold of the trigger (14 in FIG. 1) are graphed as dashed lines. The spacing between these two thresholds corresponds to the hysteresis in the trigger circuit. A value of $U_{ss}$ in excess of the higher threshold indicates that $U_{ss}$ is not attenuated by the oscillator, for example, due to underdamping by a large spacing a of the trip cam from the active surface of the proximity switch or due to the "positive" control pulses fed to the oscillator. (By "positive", it is meant here that the control pulse tends to increase the amplitude of oscillation of the oscillator). Similarly, a value of $U_{ss}$ lower than the lower threshold indicates that $U_{ss}$ is attenuated by the oscillator, for example, due to damping by a small spacing a of the trip cam from the active surface of the proximity switch or due to the "negative" control pulses fed to the oscillator. As also shown in FIG. 3, the amplitude of each of the positive and negative control pulses preferably just exceeds the magnitude of the difference in voltage between the higher threshold and the lower threshold of the trigger.

Returning now to FIG. 2, the output signal of the oscillator 10 with the superimposed test pulses is rectified in the demodulator 12 comprising in the conventional manner two capacitors C3, C4, two diodes D1, D2 and a resistor R6, and is fed to the input of the trigger stage 14. The trigger stage 14 also comprises in the conventional manner two transistors T3, T4 and several resistors R7 to R14 as well as a capacitor C5. The switching thresholds at the adjustable resistor R9 are settable, while C5 ensures maintenance of the hysteresis of the trigger stage 14. The output of the trigger stage 14, i.e., the collector of the transistor T4, is connected to the amplifier 20 comprising a power transistor T5 (Darlington circuit) with a base voltage divider consisting of two resistors R14 and R15, and a Zener diode D3 connected in parallel with the collector-emitter-section of the transistor T5, with the collector of the transistor T5 being connected to the output A via a temperature-dependent PTC resistor (positive temperature coefficient resistor) with a positive temperature coefficient as protection against short-circuits. In the exemplary embodiment, there is located in the input line of the test circuit 18 connected to the output A a capacitor C6 whose electrode remote from the output A is connected via a first diode D4 to the negative pole $-U$ of the supply voltage source and via a second diode D5 to the base of an output transistor T6, with the base of the transistor T6 being connected via a capacitor C7 to the negative pole $-U$, with the emitter of the transistor T6 likewise being connected to the negative pole $-U$ via a resistor R16, and with a relatively large capacitor, for example, with a capacitance of 1 $\mu F$, designated by the reference numeral C8, being connected in parallel with the collector-emitter-section of the transistor T6. It is apparent that the transistor T6 of the test circuit is brought into the conductive state by positive switching edges at the output of the amplifier 20 and discharges the capacitor C8 to the negative pole $-U$ in the presence of these positive switching edges. In the absence of these positive switching edges, the capacitor C8 is charged by current flowing through R17 from the positive pole $+U$. Consequently, the presence or absence of the positive switching edges is indicated by voltage at the terminal P, which always has a value close to $-U$ in the presence of the positive switching edges, and which increases to and reaches $+U$ a certain time after the cessation of the positive switching edges, depending on the RC time constant of the resistor R17 and the capacitor C8. The failure of the transistor T6 to be repetitively brought into its conductive state within this RC time constant is therefore indicated by the voltage at the terminal P reaching a substantial level, which signals the presence of a malfunction in the proximity circuit.

From the above description it is evident that the double pulses generated by the test pulse source are applied to a corresponding terminal of the oscillator or are coupled into it in such a way that the current flowing at the pertinent terminal and/or the voltage present at the pertinent terminal is superimposed with them. In this case, the supply voltage for the oscillator may, for example, be switched for a short time to a higher and to a lower level with respect to the normal voltage in order to thus generate a corresponding double pulse. If required, a combined superimposition of the supply current and the supply voltage with double pulses from the test pulse source is also possible. In accordance with the invention, there is, in any case, no connection or disconnection of resistances by the test pulses in the oscillator, as in hitherto common practice for simulation of damping or damping reduction. The internal parameters of the oscillator co-determined by the hitherto connected or disconnected resistances are therefore not influenced, but rather the double pulses serving as test pulses are at a certain location "placed onto" the current flowing there and/or the voltage present there, without the internal parameters of the oscillator being influenced thereby.

It is particularly advantageous for the double pulses to be coupled-in via a current mirror circuit, as is known from IC technology.

What is claimed is:

1. A self-testing proximity switch comprising an oscillator for generating an oscillating signal wherein the proximity of an object causes a damping of the amplitude of said oscillating signal; a demodulator coupled to said oscillator and responsive to said oscillating signal for providing a demodulated signal having a value indicating the amplitude of said oscillating signal; a trigger stage coupled to said demodulator and providing a trigger output of the proximity switch and assumming one of two switching states in response to the value of said demodulated signal exceeding a higher threshold and assuming the other of said switching states in response to the value of said demodulated signal falling below a lower threshold; a clocked test pulse source which feeds test pulses to said oscillator, said test pulses having positive and negative amplitudes sufficient to cause said trigger stage to toggle temporarily from either one of said switching states to the other of said states for the duration of a respective polarity of said test pulses and then return to the previous state; and a test circuit coupled to said trigger stage and responsive to the toggling of said trigger stage caused by said test pulses and providing a test output signal for indicating any absence of said toggling to thereby signal a malfunction of said proximity switch;

wherein said oscillator operates in an analog manner with an oscillation amplitude that is continuously variable in response to said dampening, and said test pulses are bipolar double pulses which are combined with the supply voltage and/or supply current fed to said oscillator to modulate said amplitude of oscillation in response to said bipolar double pulses, said test pulses having no substantial affect on the internal operating parameters of said oscillator.

2. The proximity switch as claimed in claim 1, wherein the test circuit is in the form of an active amplifier circuit.

3. The proximity switch as claimed in claim 2, wherein the test circuit is inductively coupled to the output of the trigger stage.

4. The proximity switch as claimed in claim 2, wherein the test circuit is in the form of a current source circuit.

5. The proximity switch as claimed in claim 1, wherein the test pulse source is coupled via a capacitor to the oscillator for capacitive coupling-in of the test pulses.

6. The proximity switch as claimed in claim 1, wherein the test pulse source is inductively coupled to the oscillator for inductive coupling-in of the test pulses.

7. The proximity switch as claimed in claim 1, wherein the duration of the test pulses is shorter than the response time of a switching device controlled by the trigger output of the proximity switch.

8. The proximity switch as claimed in claim 7, wherein the duration of the test pulses is shorter than 0.5 ms.

9. The proximity switch as claimed in claim 1, wherein the pulse repetition frequency of the test pulses is approximately 200 Hz.

10. The proximity switch as claimed in claim 1, wherein the amplitude of the positive and of the negative single pulses of the test pulses is chosen such that at each operating point of the trigger stage, the switching threshold of the trigger stage further removed from this operating point is just still exceedable.

11. The proximity switch as claimed in claim 10, wherein the positive and the negative amplitude of the single pulses of the test pulses corresponds exactly to the amplitude change when the oscillator is damped by a trip cam associated with the proximity switch.

12. The proximity switch as claimed in claim 1, wherein the test circuit is in the form of a bistable switching stage with two antivalent outputs.

13. The proximity switch as claimed in claim 1, wherein the test circuit is designed such that the signal at the test output during trouble-free operation is respectively antivalent to the signal at the trigger stage output of the proximity switch.

14. The proximity switch as claimed in claim 1, wherein the test circuit is spatially proximate to the other components of the proximity switch.

15. The proximity switch as claimed in claim 1, wherein the test circuit is in the form of a component of a switching device controlled by the proximity switch, and is spatially separate from the other circuits of the proximity switch.

16. A self-testing proximity switch comprising an oscillator for generating an oscillating signal wherein the proximity of an object causes a damping of the amplitude of said oscillating signal; and demodulator coupled to said oscillator and responsive to said oscillating signal for providing a demodulated signal having a value indicating the amplitude of said oscillating signal; a trigger stage coupled to said demodulator and providing a trigger output of the proximity switch and assumming one of two switching states in response to the value of said demodulated signal exceeding a higher threshold and assuming the other of said switching states in response to the value of said demodulated signal falling below a lower threshold; a clocked test pulse source which feeds test pulses to said oscillator, said test pulses having positive and negative amplitudes sufficient to cause said trigger stage to toggle temporarily from either one of said switching states to the other of said states for the duration of a respective polarity of said test pulses and then return to the initial state; and a test circuit coupled to said trigger stage and responsive to the toggling of said trigger stage caused by said test pulses and providing a test output signal for indicating any absence of said toggling to thereby signal a malfunction of said proximity switch;

wherein said oscillator operates in an analog manner with an oscillation amplitude that is continuously variable in response to said damping, said test pulses are in the form of bipolar double pulses, said oscillator has an input terminal for combining the test pulses with the supply voltage and/or current fed to said oscillator for modulating the amplitude of oscillation in an analog manner such that the amplitude of oscillation is also continuously variable in response to a signal at said input terminal, and said bipolar double pulses are fed to said input terminal so that said amplitude of oscillation is modulated in an analog manner by said test pulses, said test pulses having no substantial affect on the internal operating parameters of said oscillator.

17. The proximity switch as claimed in claim 16, wherein said test pulse source is capacitively coupled to said input terminal.

18. The proximity switch as claimed in claim 16, wherein the logic state of said trigger stage controls a switching device having a certain response time, and the duration of the test pulses is shorter than said response time, so that said test pulses do not interrupt the operation of said switching device.

19. The proximity switch as claimed in claim 16, wherein said trigger stage has hysteresis, and the positive and negative amplitudes of said test pulses are each selected to cause a corresponding change in oscillation amplitude which just exceed the corresponding difference between said threshold levels.

20. The proximity switch as claimed in claim 16, further comprising a trip cam for selective damping of said oscillation amplitude, and wherein the extent of said selective damping is approximately said corresponding change in oscillation amplitude.

* * * * *